US006836149B2

(12) United States Patent
Chow

(10) Patent No.: US 6,836,149 B2
(45) Date of Patent: Dec. 28, 2004

(54) VERSATILE RSDS-LVDS-MINILVDS-BLVDS DIFFERENTIAL SIGNAL INTERFACE CIRCUIT

(75) Inventor: James Chow, Palo Alto, CA (US)

(73) Assignee: STMicroelectronics, Inc., Carrollton, TX (US)

( * ) Notice: Subject to any disclaimer, the term of this patent is extended or adjusted under 35 U.S.C. 154(b) by 75 days.

(21) Appl. No.: 10/121,625

(22) Filed: Apr. 12, 2002

(65) Prior Publication Data

US 2003/0193350 A1 Oct. 16, 2003

(51) Int. Cl.[7] .......................................... H03K 19/0175
(52) U.S. Cl. .............................. 326/83; 326/37; 326/86; 326/90
(58) Field of Search ............................ 326/37, 82, 83, 326/86, 90; 327/108, 543

(56) References Cited

U.S. PATENT DOCUMENTS 6,111,431 A    8/2000  Estrada 6,329,843 B1 * 12/2001 Hirata et al. ................... 326/82
6,356,141 B1 *  3/2002 Yamauchi ..................... 327/543
6,433,579 B1 *  8/2002 Wang et al. ................... 326/38

* cited by examiner

Primary Examiner—Anh Q. Tran
(74) Attorney, Agent, or Firm—Stephen C. Bongini; Lisa K. Jorgenson

(57) ABSTRACT

An electronic circuit includes a selectively configurable differential signal interface and a selection control input for selecting one of a plurality of standard differential signal interfaces for configuration of the differential signal interface. The selection control input selects one of the following plurality of standard differential signal interfaces: reduced swing differential signaling (RSDS), low voltage differential signaling (LVDS), mini low voltage differential signaling (mini-LVDS), and bussed low voltage differential signaling (BLVDS), for configuration of the differential signal interface. The electronic circuit may also include a plurality of selectable voltage sources (611, 612, 613) and a plurality of selectable current sources (614, 615, 616, 617), for selecting, in response to an input signal at the selection control input, at least one of an operating D.C. voltage, a standard differential signal voltage, and a standard differential signal current for the differential signal interface.

8 Claims, 8 Drawing Sheets

126

300

Requirements for Transmission Interface Standards

|  | RSDS | LVDS | mini-LVDS | BLVDS |
|---|---|---|---|---|
| Vod | 200 mV | 345 mV | 400 mV | 400 mV |
| Vos | 1.3 V | 1.25 V | 1.2 V | 1.25V |
| Iout | 2 mA | 3.45 mA | 4 mA | 8 mA |

VERSATILE RSDS-LVDS-MINILVDS-BLVDS DIFFERENTIAL SIGNAL INTERFACE CIRCUIT

BACKGROUND OF THE INVENTION

1. Field of the Invention

The present invention relates to the field of transistor driver circuits and in particular, to a versatile reduced swing differential signal, low voltage differential signal, mini low voltage differential signal, and bus low voltage differential signal interface circuit for backplane applications.

2. Description of Related Art

A variety of electronic devices, such as computers, monitors, flat panel displays, to name just a few, utilize high-speed differential data transmission in which the difference in voltage levels between two electronic signal lines form the transmitted signal. Differential data transmission is commonly used for data transmission rates greater than 100 Mbps over long distances, as well as in transfer of data to various display monitors such as LCD panels, notebook hosts to flat panel displays, and backplane rack-to-rack devices. Noise signals shift the ground level voltage and appear as common mode voltages. Thus, the detrimental effects of noise are substantially reduced.

To standardize such data transmission, a large variety of standards for interfaces have been developed. For example, one such standard is the TIA/EIA-644 standard low voltage differential signaling, LVDS, which is defined by the Electronics Industry of America, EIA and the Telecommunications Industry of America, TIA. This standard may operate in the Giga bit per second data rate range over a pair of signal lines. Driver circuits place signals on the lines. These driver circuits are intended to transmit differential signals with a nominal signal swing of 345 mV over the pair of transmission lines, which typically terminates in a single load of 100 ohms of resistance.

While the popularity of LVDS signaling is increasing every year, there are certain limitations, such as its limited common-mode range, and also its intended load of a single 100-Ohm termination. For this reason, LVDS-like signaling standards have been adopted for other applications. Other common signaling standards include Bus LVDS (BLVDS), reduced swing differential signaling (RSDS) and mini-low voltage differential signaling (mini-LVDS).

Bus LVDS extends the benefits of LVDS by targeting heavily loaded backplanes where card loading and spacing lowers the impedance of the transmission line as much as 50%. Therefore, the termination resistance for a BLVDS interface may vary from 40 to 200 ohms, while the nominal differential signal is 400 mV. The BLVDS interface can be used for multi-drop, multi-point, or point-to-point applications.

Reduced Swing Differential Signaling (RSDS) is a differential interface with a nominal signal swing of 200 mV. It retains the many benefits of the LVDS interface, such as high noise immunity, high data rate, low EMI characteristics, and low power dissipation. However, since RSDS applications are typically within a sub-system such as row/column drivers for an LCD screen, the signal swing is reduced from LVDS to lower power even further (hence the "Reduced Swing" or RS of the RSDS). RSDS is typically used in point-to-point or multi-drop application configurations.

Mini-LVDS is a new high-speed serial interface, which offers a low EMI, high bandwidth interface for display drivers, which is particularly well suited for thin film transistor (TFT) LCD panel column drivers. Mini-LVDS may be used for point-to-point and multi-drop applications.

While each interface standard has advantages, a designer must decide upon an appropriate standard at the very initial stages of a design, even though the basic function of the driver is the same regardless of the chosen standard. Many consequential decisions for designing an electronic device are then dictated by the standard chosen for the driver interface. The variety of receivers that will function properly with the predetermined standard interface is then limited in that the receiver must also adhere to the selected standard. As a result, manufacturers are required to stock different driver elements for each standard if they are to produce electronic products that happen to use different standard interfaces. This adds unnecessary restrictions and cost to a design.

Thus, there is a need to overcome the disadvantages of the prior art as discussed above, and in particular to provide a versatile RSDS, LVDS, mini-LVDS, and BLVDS driver for backplane applications.

BRIEF DESCRIPTION OF THE DRAWINGS

FIG. 3 is a table illustrating voltage and current requirements for RSDS, LVDS, mini-LVDS, and BLVDS interface standards.

DETAILED DESCRIPTION OF THE PREFERRED EMBODIMENTS

The present invention, according to a preferred embodiment, overcomes problems with the prior art by implementing a versatile differential interface that functions properly for a variety of interface standards such as RSDS, LVDS, BLVDS and mini-LVDS. The interface is selectably configurable via a plurality of selection control lines. This allows an electronic circuit designer the versatility to choose from a multitude of receivers for the data transfer, while using only one driver. For example, a graphics card within a PC could now be configured to work with a monitor whose link receiver was designed for an LVDS interface, or a BLVDS interface.

Also, the same driver that is used to carry information across a network link interface, such as LVDS or BLVDS, can also be configured to work properly as the driver for a sub-system, such as an FPD column driver, using RSDS or mini-LVDS technology. This eliminates the need to have different driver IC's for each function.

Figure 1:
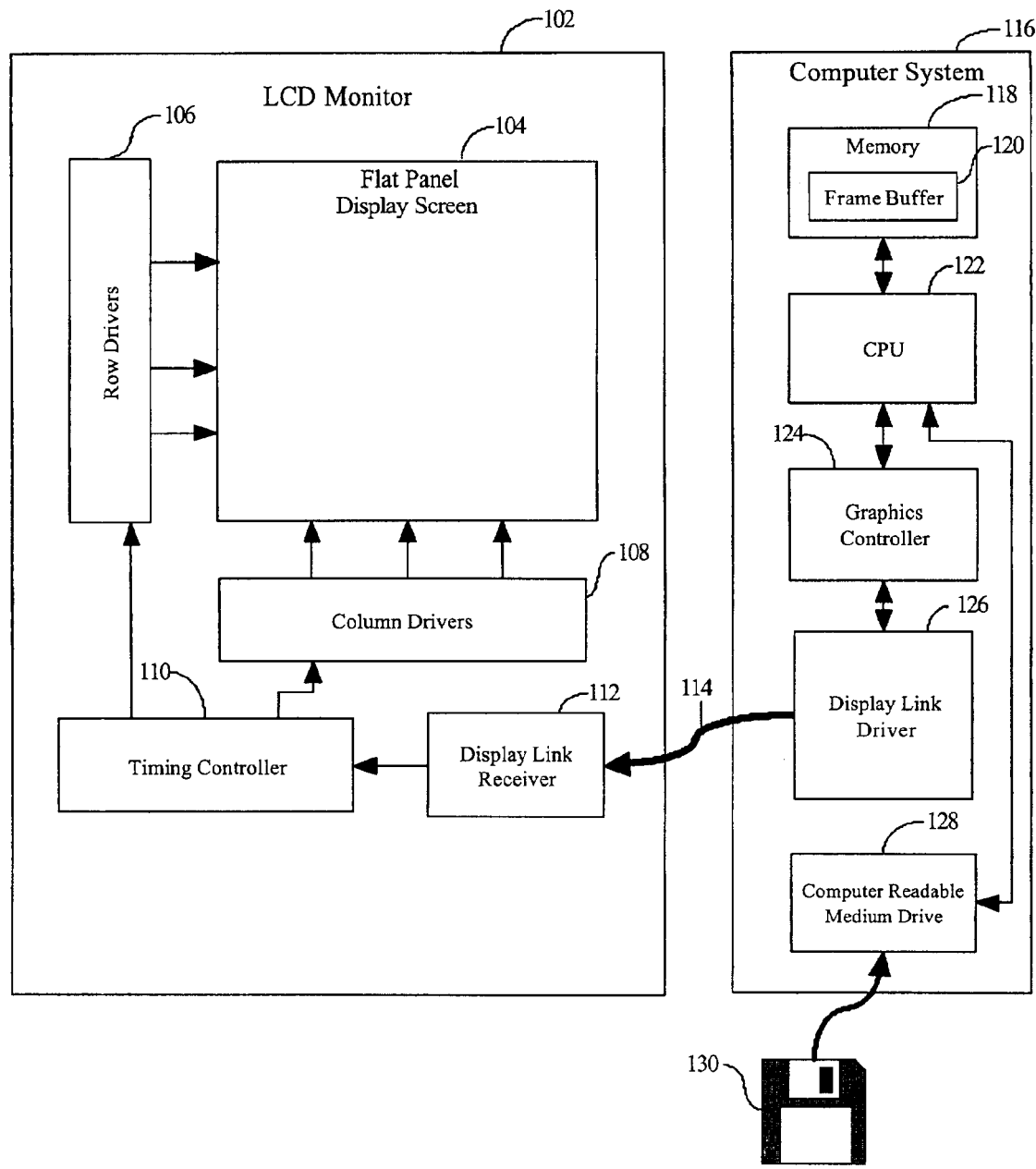
FIG. 1 is a functional block diagram of an exemplary video signaling system, in accordance with a preferred embodiment of the present invention.

Referring to FIG. 1, an exemplary application of a preferred embodiment of the present invention operates in a flat panel display monitor system 100. A graphics card inside a PC (computer system 116) typically contains a graphics controller 124 and a frame buffer 120. The computer system 116, according to the present example, includes a controller/processor 122, which processes instructions, performs calculations, and manages the flow of information through the computer system 116. Additionally, the controller/processor 122 is communicatively coupled with memory 118, a computer readable medium drive 128, and the graphics controller 124. The graphics controller 124 renders a frame of data in memory 118 then converts the data to analog and transmits to a display link driver (transmitter) 126. This video signal from the graphics controller 124 is received at the inputs to a display link driver 126 in parallel TTL (transistor-transistor logic) or CMOS (complementary metal oxide semiconductor) logic form. In addition to the analog data, horizontal and vertical synchronization signals are transmitted. The parallel TTL or CMOS data is converted by the display link driver 126 to an interface transmission standard, such as LVDS, and delivered via a cable 114 to a display link receiver 112 of a liquid crystal display (LCD) monitor 102 or cathode ray tube (CRT) monitor (not shown). The display link driver 126 includes a preferred embodiment of the present invention, as will be discussed below.

The received data is then converted back to TTL or CMOS levels at the display link receiver 112 and sent to the inputs of a timing controller 110. The timing controller 110 then transfers the data to row drivers 106 and column drivers 108 of a flat panel display screen 104, which presents the video image. The timing controller 110 may deliver the data to the row and column drivers 106, 108 via a second display link driver interface (not shown). The second display link driver interface may be the same circuit used for the display link interface 126, configured for a different interface standard (typically RSDS or mini-BLVDS).

The graphics controller 124 may be configured to receive updates via a computer readable medium. The computer readable medium allows a computer system to read data, instructions, messages or message packets, and other computer readable information from the computer readable medium. The computer readable medium, for example, may include non-volatile memory, such as Floppy, ROM, Flash memory, Disk drive memory, CD-ROM, and other permanent storage. It is useful, for example, for transporting information, such as data and computer instructions, between computer systems. Furthermore, the computer readable medium may comprise computer readable information in a transitory state medium such as a network link and/or a network interface, including a wired network or a wireless network, that allow a computer to read such computer readable information.

Figure 2:
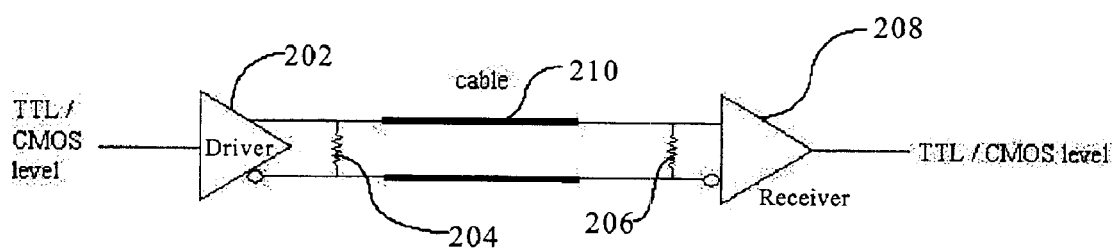
FIG. 2 is a functional block diagram illustrating a typical point-to-point configuration using RSDS, LVDS, mini-LVDS, or BLVDS interface standards.

FIG. 2 illustrates a typical point-to-point configuration for a bus configuration using RSDS/LVDS/mini-LVDS/BLDVS interface standards. Point-to-point is the simplest bus configuration. The source (driver 202), is at one end, then the interconnecting media such as cables 210, and at the other end is a 100 ohm termination resistor 206 and the receiver 208. BLVDS also includes an additional termination resistor 204 at the source side. Due to the clean signaling path, a point-to-point bus supports the highest data rates. Standard values for the differential output voltage swing, nominal single-side voltage, and output currents of each interface standard are shown in FIG. 3. Note that for BLVDS, $I_{out} = V_{od}/R_{term}$, where $R_{term} = R_{term(source)} \| R_{term(load)} \sim 50$ ohms.

Figure 4:
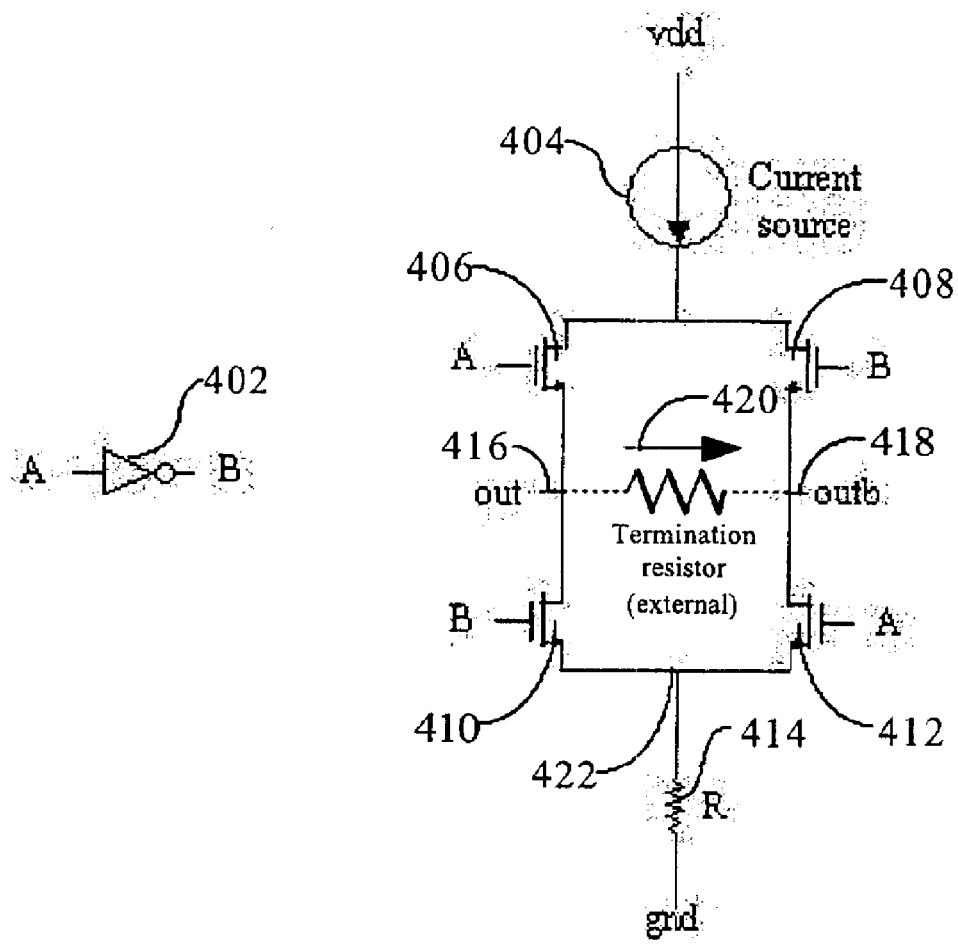
FIG. 4 is an electrical schematic diagram of a prior art driver circuit used in RSDS, LVDS, mini-LVDS, or BLVDS interfaces.

An example of a typical low voltage differential signal driver circuit 400 is shown in FIG. 4. The pair of differential signals is formed by the difference in voltage levels between the output signals out and outb on the output terminals 416, 418. The driver includes a direct current (DC) source 404 coupled to a voltage supply, four n-channel metal oxide semiconductor transistor switches 406, 408, 410, 412, and a resistor 414 coupled between the common node 422 and ground. The four transistor switches 406, 408, 410, 412 are controlled by input signals A and B. A and B are typically rail-to-rail voltages swings, with signal B being 180° out of phase with signal A, as a result of signal A passing through an inverter 402. The gates of switches 406 and 412 couple together to receive input signal A, while switches 408 and 410 receive signal B. When input A is high and B is low, current flows in the direction indicted by the arrow 420 in FIG. 4. When B is high and A is low, the current flow is reversed, generating an opposite voltage drop at the receiver end.

Disadvantages of the Prior Art Driver:

D1). Single Interface Standard. The circuit of FIG. 4 will only work with one standard. In order to meet the $V_{od}$ spec, the current from the current source 404 times the 100 ohm termination resistor 424 has to equal the values shown in FIG. 3 for the specific standard. The circuit must be fabricated with the current source 404 designed to meet the specific requirement.

D2). DC Specifications. $V_{oh}$, $V_{ol}$, and $V_{os}$ of the out and outb signals are gratly dependant on the value of the terminating resistor 414, resistance of the switching transistors 406, 408, 410, 412, and accuracy of the current source 404. With typical IC fabrication process variation of +/−30% for resistors and 200 mV for CMOS transistor thresholds, plus temperature and Vdd changes, it is very difficult to meet tight DC specifications for $V_{oh}$, $V_{ol}$, and $V_{os}$ without using a higher cost BiCMOS process.

Figure 5:
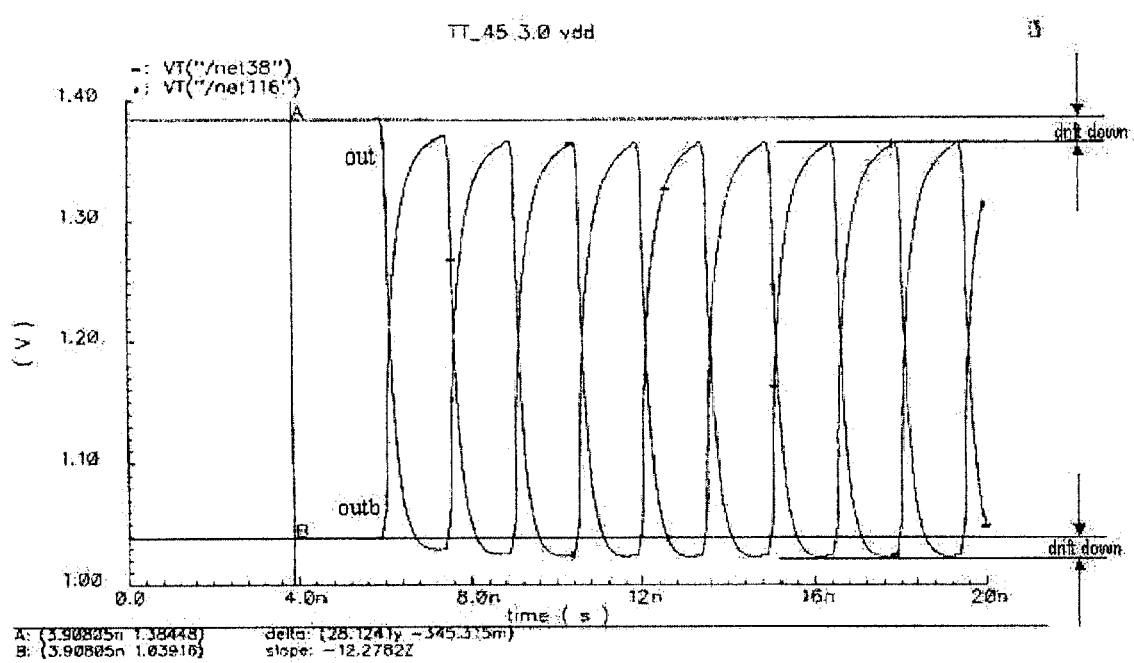
FIG. 5 illustrates a transient analysis of results of the prior art driver circuit of FIG. 4.

D3). AC Performance. As shown in the transient analysis of FIG. 5, output waveforms display a drift down from DC due to multi-cycle switching levels. The output levels can also drift up, depending on the circuit characteristics and different process corners, Vdd, and temperature changes. This drifting causes reduction of the noise margin and shows degradation in the eye pattern.

Figure 6:
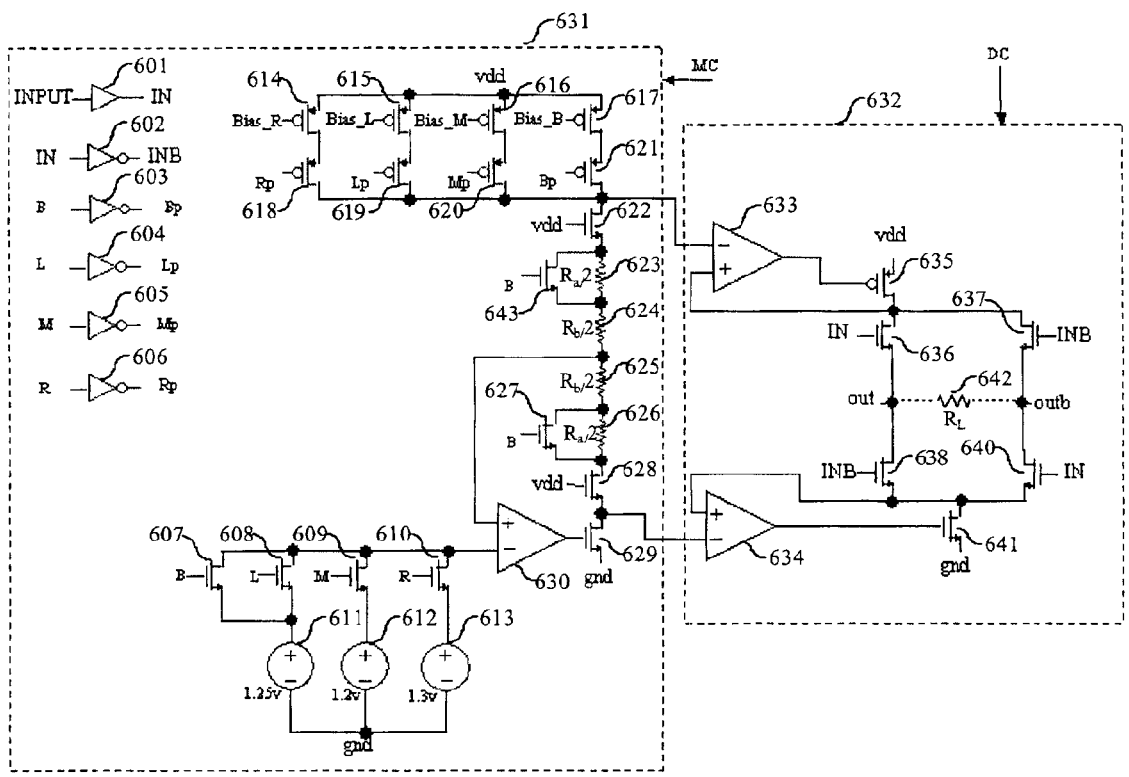
FIGS. 6 and 7 are electrical schematic diagrams of exemplary versatile RSDS/LVDS/mini-LVDS/BLVDS driver circuits as shown in FIG. 1, in accordance with a preferred embodiment of the present invention.
Figure 7:
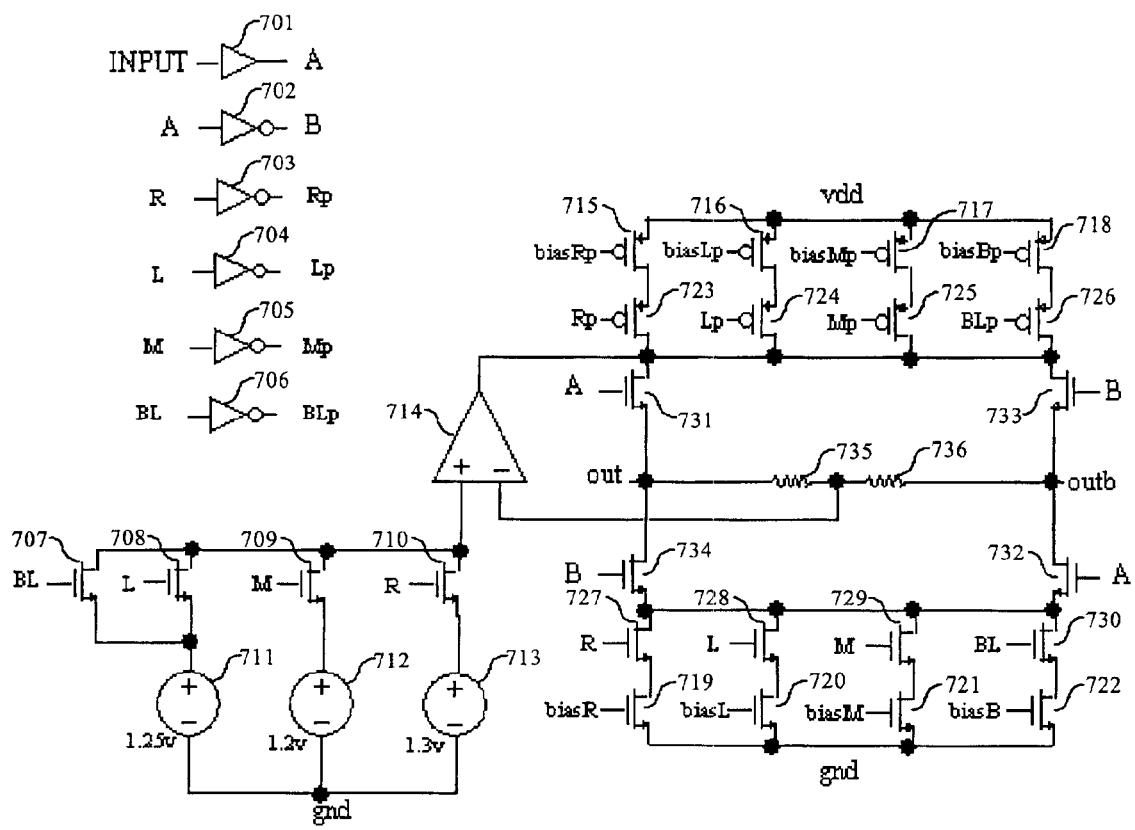

FIGS. 6 and 7 illustrate preferred embodiments of a new and novel circuit functioning in the display link driver 126 for transmitting differential signals adhering to industry interface standards. In particular, the new and novel driver 126 solves the problems with the prior art and provides the option of configuring the circuit to transmit signals meeting a variety of industry interface standards including RSDS, LVDS, mini-LVDS, and BLVDS, in a cost effective and reliable manner. The driver of FIG. 6 expands upon the concepts presented in U.S. Pat. No. 6,111,431 "LVDS Driver for Backplane Applications" filed on May 14, 1998, the entire teachings of which are hereby incorporated by reference. A number of features and advantages of the new and novel driver 126 will be discussed below.

Some of the Advantages:

A1). All prior art only performs according to one interface standard. The driver 126 of FIG. 6 meets the requirements of 4 interface standards—RSDS, LVDS, mini-LVDS, and BLVDS.

A2). The adjustable resistors 623, 624, 625, 626 match external termination resistance for different applications. Present driver circuits only match one termination resistance.

A3). $V_{os}$ is selectable in order to meet requirements of the 4 interface standards. Present driver circuits are biased using only one $V_{os}$.

A4). The versatility of being able to select different interface standards does not pay a penalty in current consumption.

With reference to FIG. 6, a preferred embodiment of the present invention includes a mimicking circuit (MC) 631 and a driving circuit (DC) 632. The DC block 632 operates according to U.S. Pat. No. 6,111,431, which fully explains the details of operation of the DC block according to the present example. The novel MC block 631 allows a designer to select a standard transmission interface from a choice of RSDS, LVDS, mini-LVDS, and BLVDS.

A summary of the circuit blocks in the MC block 631 is discussed below.

Circuit Blocks

601: Buffer amplifier

Buffer may preferably be an inverter made of a pmos and an nmos transistor. By changing the pmos/nmos sizes, the threshold can be adjusted to meet CMOS or TTL signaling requirements. Buffer may also be made with hysteresis to further increase noise immunity.

602, 603, 604, 605, 606: Inverters

Provide a signal 180° out of phase with the input signal.

618, 619, 620, 621, 607, 608, 609, 610: Switches

Used to select standard interface for current application.

643, 627: Switches

Turned on when the selected interface standard is BLVDS in order to negate resistance across resistors 623 and 626.

614, 615, 616, 617: Selectable Current Sources

Designed to meet requirements of each standard. For example, 614 is 2 mA, 615 is 3.45 mA, 616 is 4 mA, and 617 is 8 mA.

611, 612, 613: Selectable Voltage Sources

Designed to meet requirements of each standard. For example, 611 is 1.25V, 612 is 1.2V, and 613 is 1.3V.

623, 624, 625, 626: Matching Resistors

Used to match termination resistance for selected standard.

630: Operational Amplifier:

Amplifier used to set reference voltage to meet $V_{os}$ of selected standard.

A summary of the functions of the circuit blocks is discussed below.

Detailed Circuit Description

With reference to FIG. 6, there are 4 control lines: R, L, M, and B, which select the standards RSDS, LVDS, mini-LVDS, and BLVDS respectively. A standard is selected by pulling the control line for the selected standard high. The remaining control lines must remain low. The control lines may be operated by another device such as a microcontroller, or may be hardwired to allow only the selected standard to function. As an example, assume R is pulled high. This switches on the nmos transistor 610, which places the reference voltage of the selected voltage source 613 (1.3V) at the negative terminal of the operational amplifier 630. At the same time, $R_p$ is pulled low by way of the inverter 606, which turns on the pmos switch 621. This enables the current mirror 617 to turn on, which sets the current through the mimicking circuit at the correct level (2 mA for RSDS).

The voltage drop from the drain of transistor 622 to the drain of transistor 629 of the mimicking circuit 631 mimics the voltage drop from the drain of transistor 635 to the drain of transistor 641 in the driving circuit 632. For RSDS, LVDS, and mini-LVDS, the total resistance of 623, 624, 625, and 626 is $$R_a + R_b = R_{L1}$$

where $R_{L1}$ is the termination resistance across the output terminals out and outb of the driving circuit 632. This is typically 100 ohms. For BLVDS, the switching transistors 643 and 627 are activated when control line B is pulled high. This shorts out resistors 623 and 626, thereby leaving only 624 and 625 ($R_b$) to match with the termination resistance (typically less than 100 ohms).

The mimicking circuit 631 establishes the amount of drive current provided by transistor 635, and the sink current of transistor 641. The voltages at the drain of 635 and 641 are fedback to the positive terminals of the operational amplifiers 633 and 634 respectively. These voltages are compared to the reference voltages set by the MC 632 at the negative terminals of each opamp 633, 634 and the output voltages of 633 and 634 are adjusted accordingly, thereby controlling the amount of current through 635 and 641 and setting the nodes at the drains of 635 and 641 at a constant voltage equivalent to the differential swing voltage of the chosen standard.

Referring to FIG. 7, an alternative embodiment of the present invention provides the same functions using fewer components. A number of features and advantages of the new and novel driver circuit 700 will be discussed below.

Some of the Advantages:

A1). Meets the requirements of 4 interface standards—RSDS, LVDS, mini-LVDS, and BLVDS.

A2). Accurate $V_{os}$ setting—uses direct $V_{os}$ measurement for feedback loop.

A3). Stable loop stability—bias transistors share supply current.

A4). No external termination resistor vs. internal resistor matching requirement.

A5). Ease of design—only needs a Bandgap circuit to generate constant voltages and currents. It can easily meet $V_{oh}$, $V_{ol}$, $V_{os}$, and $V_{od}$ specs.

A6). No signal switching drift problem.

A7). Use only one amplifier and few other added components.

A8). Low $I_{dd}$ consumption due to low component count.

A9). Optimized circuit area translates into low cost.

A summary of the circuit blocks in the driver circuit 700 is discussed below.

Circuit Blocks

701: Buffer amplifier

Buffer may preferably be an inverter made of a pmos and an nmos transistor. By changing the pmos/nmos sizes, the threshold can be adjusted to meet CMOS or TTL signaling requirements. Buffer may also be made with hysteresis to further increase noise immunity.

702, 703, 704, 705, 706: Inverters

Provide a signal 180° out of phase with the input signal.

707, 708, 709, 710, 723, 724, 725, 726, 727, 728, 729, 730: Switches

Used to select standard interface for current application.

714: Operational Amplifier

Amplifier used to set reference voltage to meet $V_{os}$ of selected standard.

719, 720, 721, 722: Selectable Current Sources

Designed to meet requirements of each standard. For example, 719 is 2 mA, 720 is 3.45 mA, 721 is 4 mA, and 722 is 8 mA.

715, 716, 717, 718: Selectable Current Sources

Designed to supply less than 100% of the required standard current. This leaves margin for mismatch to 719, 720, 721, 722. Amplifier 714 supplies the difference instead of letting amplifier supply 100% of the current. This increases the loop stability and allows for implementation of a much smaller and higher bandwidth amplifier for high-speed data transmission.

711, 712, 713: Selectable Voltage Sources

Designed to meet requirements of each standard. For example, 711 is 1.25V, 712 is 1.2V, and 713 is 1.3V.

735, 736: Resistors

Used to extract $V_{os}$ of the output signal.

731, 732, 733, 734: Nmos transistors

Used to drive differential signal.

A summary of the functions of the circuit blocks is discussed below.

Detailed Circuit Description

With reference to FIG. 7, again there are 4 control lines: R, L, M, and BL, which select the standards RSDS, LVDS, mini-LVDS, and BLVDS respectively. A standard is selected by pulling the control line for the selected standard high. The remaining control lines must remain low. The control lines may be operated by another device such as a microcontroller, or may be hardwired to allow only the selected standard to function. As an example, assume R is pulled high. This switches on the nmos transistor 710, which places the reference voltage of voltage source 713 (1.3V) at the positive terminal of the operational amplifier 714, and enables the current mirror 719 by turning on transistor switch 727. At the same time, $R_p$ is pulled low by way of the inverter 703, which turns on the pmos switch 723. This enables the current mirror 719, which sets the current through the circuit at the correct level (2 mA for RSDS). The current mirrors 715, 716, 717, and 718 are designed to operate at slightly less than 100% of the required current for the chosen standard (for example, 80%). This allows for mismatch between the lower current mirrors 719, 720, 721, and 722 and the upper current mirrors 715, 716, 717, and 718. The operational amplifier 714 provides the remaining current. This increases the loop stability and allows for implementation of a much smaller and higher bandwidth amplifier for high-speed data transmission.

Transistors 731, 732, 733, 734 provide a current steering circuit to drive the differential signals as discussed in the prior art. The pair of differential signals is formed by the difference in voltage levels between the output signals out and outb on the output terminals. The four transistor switches 731, 732, 733, 734 are controlled by input signals A and B. A and B are typically rail-to-rail voltages swings, with signal B being 180° out of phase with signal A, as a result of signal A passing through an inverter 702. The gates of switches 731 and 732 couple together to receive input signal A, while switches 733 and 734 receive signal B. When input A is high and B is low, current flows through transistor 731, resistors 735 and 736, and transistor 732. When B is high and A is low, the current flow is reversed, generating an opposite voltage drop at the receiver end.

Two resistors 735, 736, having a value of $R_s$, are added in series between the output terminals out and outb. The midpoint is connected to the negative input of the operational amplifier 714 and compared to the reference voltage selected from the three different voltage sources 711, 712, 713 at the positive input. If the output $V_{os}$ is lower than the reference voltage, the amplifier 714 will raise its output voltage to pull up out and outb in order to compensate for the difference. If the output $V_{os}$ is higher, the output voltage will be lowered. Setting the value of $R_s$ 735, 736 such that $R_s >> R_L$ (where $R_L$ is the external termination load resistor) ensures that the $R_s$ will not consume too much power. However, due to its shunt current, the dc level will be slightly affected. To compensate for this dc shift, the current of the lower current mirrors 719, 720, 721, 722 will need to be slightly higher.

Figure 8:
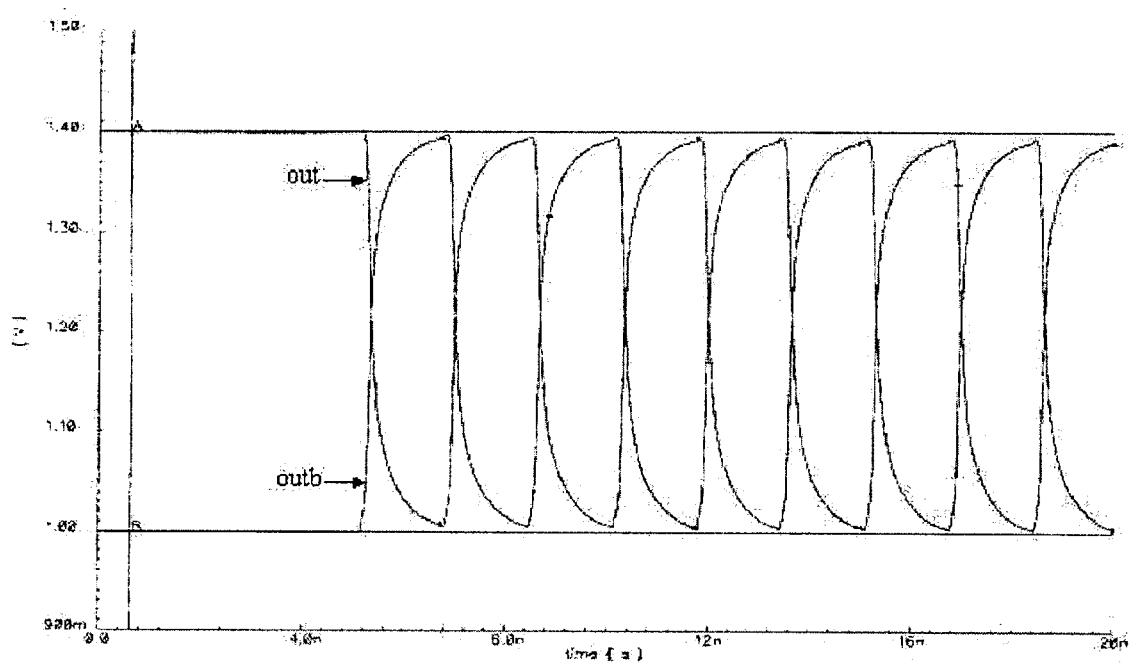
FIG. 8 illustrates a transient analysis of results of the exemplary versatile RSDS/LVDS/mini-LVDS/BLVDS driver circuit as shown in FIG. 7, in accordance with a preferred embodiment of the present invention.

As shown in FIG. 8, there is no drift problem in the output waveform of circuit 700, whereas prior art may have a considerable drift depending on the circuit characteristics and different process corners, Vdd, and temperature changes. There is no reduction of the noise margin or degradation in the eye pattern.

The present invention offers significant advantages over the prior art. In prior art systems, only one interface standard was supported. However, with new electronic designs emerging daily, such as for high speed data signaling and/or for high speed video signaling systems, it requires a new and novel driver 126, according to the present invention, which provides the necessary new circuit features and functions to provide the high speed signals over a variety of standard interfaces as discussed above. The new and novel driver 126, as discussed above, provides significantly improved dc drift and noise immunity performance for devices incorporating the present invention while increasing the quality and reducing the overall costs of manufacturing such devices.

While the preferred embodiments contain transistor switches for the selection of transmission interface standard, it is understood that this function could be performed in a variety of alternative means. One such embodiment could feature a controller and memory, the controller containing control registers for directly selecting an interface standard.

Although specific embodiments of the invention have been disclosed, those having ordinary skill in the art will understand that changes can be made to the specific embodiments without departing from the spirit and scope of the invention. Additionally, many modifications may be made to adapt a particular situation to the teachings of the present invention without departing from the central inventive concepts described herein. Furthermore, an embodiment of the present invention may not include all of the features described above. The scope of the invention is not to be restricted, therefore, to the specific embodiments, and it is intended that the appended claims cover any and all such applications, modifications, and embodiments within the scope of the present invention.

What is claimed is:

1. An electronic circuit comprising:
    a selectively configurable differential signal interface;
    a selection control input for selecting one of a plurality of standard differential signal interfaces for configuration of the selectively configurable differential signal interface; and
    a plurality of selectable voltage sources and a plurality of selectable current sources, electrically coupled to the selection control input and to the selectively configurable differential signal interface, for selecting, in response to an input signal at the selection control input, at least one of an operating D.C. voltage, a standard differential signal voltage, and a standard differential signal current for the selectively configurable differential signal interface.

2. An electronic circuit comprising:
    a selectively configurable differential signal interface;
    a selection control input for selecting one of a plurality of standard differential signal interfaces for configuration of the selectively configurable differential signal interface; and a selectable voltage control circuit, electrically coupled to the selection control input and to the selectively configurable differential sign interface, for selecting at least one of an operating D.C. voltage and a standard differential signal voltage for the selectively configurable differential signal interface.

3. The electronic circuit of claim 2, wherein the at least one of an operating D.C. voltage and a standard differential signal voltage is selectable for configuring the selectively configurable differential sign interface from the following plurality of standard differential signal interfaces:

reduced swing differential signaling (RSDS), low voltage differential signaling (LVDS), mini low voltage differential signaling (mini-LVDS), and bussed low voltage differential signaling (BLVDS).

4. The electronic circuit of claim 2, further comprising:

a selectable current control circuit, electrically coupled to the selection control input and to the selectively configurable differential signal interface, for selecting at least one standard differential signal current for the selectively configurable differential signal interface.

5. An electronic circuit comprising:

at least two control lines for selecting a standard differential interface from at least two choices;

at least two selectable voltage sources, electrically coupled to the control lines, for supplying a voltage reference according to a selected standard differential interface;

at least two selectable current mirrors, electrically coupled to the control lines, for supplying current according to a selected standard differential interface;

an operational amplifier, electrically coupled to the at least two selectable current mirrors and the at least two selectable voltage sources, for comparing the voltage reference of one of the at least two selectable voltage sources to a second voltage; and a current steering circuit, electrically coupled to the operational amplifier and the at least two selectable current mirrors, for receiving a first and second input signals and providing a pair of differential signals in accordance with selected standard differential interface.

6. The electronic circuit of claim 5, wherein the standard differential interface is any one of the following plurality of standard differential signal interfaces: reduced swing differential signaling (RSDS), low voltage differential signaling (LVDS), mini low voltage differential signaling (mini-LVDS), and bussed low voltage differential signaling (BLVDS).

7. A circuit supporting substrate comprising an electronic line driver circuit comprising:

at least two control lines for selecting a standard differential interface from at least two choices;

at least two selectable voltage sources, electrically coupled to the control lines, for supplying a voltage reference according to a standard differential interface;

at least two selectable current mirrors, electrically coupled to the control lines, for supplying current according to a standard differential interface;

an operational amplifier, electrically coupled to the at least two selectable current mirrors and the at least two selectable voltage sources, for comparing the voltage reference of one of the at least two selectable voltage sources to a second voltage; and a current steering circuit, electrically coupled to the operational amplifier and the at least two selectable current mirrors, for receiving a first and second input signals and providing a pair of differential signals in accordance with a selected standard differential interface.

8. The circuit supporting substrate of claim 7, wherein the standard differential interface is selected from any one of the following:

reduced swing differential signaling (RSDS), low voltage differential signaling (LVDS), mini low voltage differential signaling (mini-LVDS), and bussed low voltage differential signaling (BLVDS).

* * * * *